United States Patent [19]
Matsuoka et al.

[11] Patent Number: 5,146,107
[45] Date of Patent: Sep. 8, 1992

[54] TRANSISTOR SWITCHING CIRCUIT HAVING DIODE-RESISTOR IN BASE OF TRANSISTOR FOR FAST DISCHARGE

[75] Inventors: Yasushi Matsuoka; Akio Matsumoto, both of Takatsuki; Yoshimi Kanda; Hirofumi Endo, both of Nagaokakyo; Tsutomu Ajioka, Takatsuki; Satoshi Motouji, Kyoto, all of Japan

[73] Assignee: Omron Corporation, Kyoto, Japan

[21] Appl. No.: 741,566

[22] Filed: Aug. 7, 1991

Related U.S. Application Data

[63] Continuation of Ser. No. 451,951, Dec. 19, 1989, abandoned.

Foreign Application Priority Data

Dec. 22, 1988 [JP] Japan .............................. 63-322034

[51] Int. Cl.$^5$ ............................................ H03K 17/60
[52] U.S. Cl. ..................................... 307/253; 307/300
[58] Field of Search ................ 330/288; 307/253, 254, 307/270, 255, 280, 300, 240; 323/315; 328/5

[56] References Cited

U.S. PATENT DOCUMENTS

| | | | |
|---|---|---|---|
| 4,228,371 | 10/1980 | Mazgy | 307/300 |
| 4,549,095 | 10/1985 | Stefani et al. | 307/254 |
| 4,697,103 | 9/1987 | Ferris et al. | 307/300 |
| 4,701,631 | 10/1987 | Chieli | 307/254 |

Primary Examiner—Stanley D. Miller
Assistant Examiner—Toan Tran
Attorney, Agent, or Firm—Fish & Richardson

[57] ABSTRACT

In a switching circuit formed as an integrated circuit, a series circuit comprising a diode ($D_1$) and a resistor ($R_1$) is connected between a base and an emitter of an npn transistor ($TR_1$) requiring a high speed switching operation. Therefore, a high speed operation is made possible. Furthermore, in a circuit constructed such that the above npn transistor is driven by a pnp transistor ($TR_3$, $TR_4$), a leakage current produced in the above pnp transistor at high temperature is allowed to flow in the above series circuit. Accordingly, a malfunction of the above npn transistor is prevented. Consequently, an integrated circuit operable even under high temperatures is achieved.

6 Claims, 4 Drawing Sheets

TRANSISTOR SWITCHING CIRCUIT HAVING DIODE-RESISTOR IN BASE OF TRANSISTOR FOR FAST DISCHARGE

This is a continuation application of Ser. No. 07/451,951 filed on Dec. 19, 1989, now abandoned.

BACKGROUND OF THE INVENTION

1. Field of the Invention

The present invention relates generally to switching circuits, and more particularly, to switching circuits suitable for implementation as an integrated circuit.

2. Description of the Related Art

When a switching circuit comprising an npn switching transistor is formed as an integrated circuit, junction capacitance occurs between a base and an emitter of this transistor in view of the device configuration. Charges stored in this junction capacitance are discharged after passing between the base and the emitter of the above switching transistor, thereby to prevent fast switching response.

When the switching circuit is so constructed that the npn switching transistor is driven by a pnp transistor, a malfunction of the switching transistor occurs due to the increase in leakage current in the pnp transistor under high temperatures.

SUMMARY OF THE INVENTION

An object of the present invention is to provide a switching circuit capable of increasing the speed of switching as well as eliminating the possibility of causing the above described malfunction.

The switching circuit according to the present invention is characterized by comprising a first transistor subjected to on-off control by a switching control signal applied to its base, a second transistor in the output stage controlled by this first transistor, and a series circuit comprising a diode functional device and a resistor connected in series and in that this series circuit is connected between the base of the above first transistor and either one of an emitter and an collector thereof.

According to the present invention, when the switching control signal for turning the first transistor off is applied, charges accumulated in a base-emitter junction region of the first transistor are rapidly discharged through the above described series circuit comprising the diode functional device and the resistor. Accordingly, an output of the first transistor is rapidly turned off, thereby allowing the speed of switching to be increased.

Furthermore, a collector leakage current, which is several hundred nanoamperes in the environment at high temperatures, in the first transistor flows through the above described diode functional device and resistor. Accordingly, the collector leakage current does not flow in the first transistor by suitably determining the value of this resistor. Consequently, a malfunction of the first transistor can be previously prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
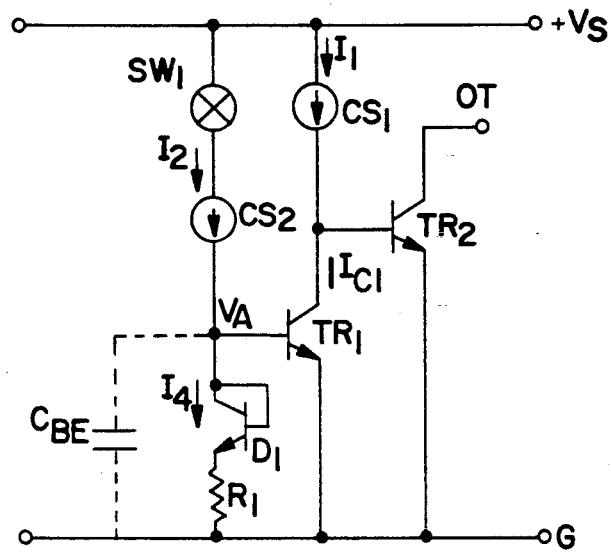
FIG. 1 is a circuit diagram showing a switching circuit according to a first embodiment of the present invention.

FIG. 1 shows a switching circuit according to a first embodiment of the present invention.

A first npn transistor $TR_1$ and a current source $CS_1$ for outputting a current $I_1$ are connected in series between a power supply $V_S$ and ground G. A second npn transistor $TR_2$ in the output stage is controlled by a potential at a node of the transistor $TR_1$ and the current source $CS_1$. A collector of the transistor $TR_2$ becomes an output terminal OT. The switching transistor $TR_1$ is controlled by a current $I_2$ outputted from a current source $CS_2$. A switching device $SW_1$ is connected to the current source $CS_2$.

In the above described circuit construction, when the switching device $SW_1$ is turned on, the output current $I_2$ of the current source $CS_2$ is applied to a base of the transistor $TR_1$. Accordingly, the transistor $TR_1$ is turned on. As a result, the output current $I_1$ of the current source $CS_1$ which has been applied to a base of the transistor $TR_2$ flows in the transistor $TR_1$, so that the transistor $TR_2$ is turned off. On the other hand, when the switching device $SW_1$ is turned off, the output current $I_2$ of the current source $CS_2$ is cut off. Accordingly, the transistor $TR_1$ is turned off. Consequently, the output current $I_1$ of the current source $CS_1$ is inputted to the base of the transistor $TR_2$, so that the transistor $TR_2$ is turned on.

When such a switching circuit is implemented as an integrated circuit, the following problems are encountered. In an integrated circuit, it has been known that junction capacitance $C_{BE}$ occurs between a base and an emitter of an npn transistor in view of the device configuration. The switching transistor $TR_1$ is an npn transistor, its junction capacitance $C_{BE}$ being represented by a broken line.

A part of the current $I_2$ flowing out of the current source $CS_2$ when the switching device $SW_1$ is on is accumulated in the junction capacitance $C_{BE}$. When the switching device $SW_1$ is changed from the on state to the off state, charges accumulated in the junction capacitance $C_{BE}$ are discharged passing between the base and the emitter of the transistor $TR_1$. Accordingly, turn-off of the transistor $TR_1$ is delayed. Consequently, the transistor $TR_1$ can not respond to a high speed switching operation.

The foregoing will be quantitatively described through specific examples. The current sources $CS_1$ and $CS_2$ shall be very small current sources, their output currents $I_1$ and $I_2$ being respectively taken as 4 μA. In addition, let the direct current amplification factor $\beta$ of the transistor $TR_1$ be 200.

When the switching device SW₁ is on, a base potential $V_A$ of the transistor TR₁ is approximately 0.6 V. More specifically, the junction capacitance $C_{BE}$ is charged to approximately 0.6 V.

The base potential $V_A$ is calculated from the following equation:

$$V_A = (kT/q) \ln(I_{E1}/I_{S1})$$

k; Boltzmann's constant
T; absolute temperature
q; charge of an electron
$I_{E1}$; emitter current in the transistor TR₁
$I_{S1}$; reverse saturation current in the transistor TR₁

Furthermore, a collector current $I_{C1}$ in the transistor TR₁ is represented by the following equation:

$$\begin{aligned} I_{C1} &= \beta I_2 \\ &= 800 \,\mu A >> I_1 \end{aligned}$$

The transistor TR₁ is turned on in the saturation region.

Immediately after the switching device SW₁ is switched from the on state to the off state, the following equations hold:

$I_{C1} = 4 \,\mu A$, and $V_A = 0.6$ V

A base current $I_{B1}$ in the transistor TR₁ is represented by the following equation:

$$\begin{aligned} I_{B1} &= I_{C1}/\beta \\ &= 0.02 \,\mu A \end{aligned}$$

Charges accumulated in the junction capacitance $C_{BE}$ begins to be discharged with an initial current of 0.02 μA. Accordingly, the collector current $I_{C1}$ is gradually decreased.

In order to overcome such problems, according to the present invention, a series circuit comprising a series connection of a diode-connected transistor (diode functional device) D₁ and a resistor R₁ is connected between the base of the switching transistor $T_{R1}$ and the ground G.

The function of this series circuit will be quantitatively described through specific examples.

The current sources CS₁ and CS₂ shall be very small current sources, their output currents I₁ and I₂ being taken as 4 μA. In addition, let the direct current amplification factor β of the transistor TR₁ be 200, and let the resistance value of the resistor R₁ be 50 Kω.

The base potential $V_A$ of the transistor TR₁ is represented by the following equation:

$$\begin{aligned} V_A &= V_{BE1} \quad (1) \\ &= V_{BED} + R_1 \cdot I_4 \end{aligned}$$

where $V_{BE1}$ is a voltage between the base and the emitter of the transistor TR₁, $V_{BED}$ is a voltage between a base and an emitter of the diode-connected transistor D₁, and $I_4$ is a current flowing in the resistor R₁.

Accordingly, taking $V_T = kT/q = 0.0259$ V (T = 300K), if $I_S$ is eliminated from the equation (2), the following equation (3) is obtained:

$$V_T \ln(I_{C1}/I_S) = V_T \ln(I_4/I_S) + R_1 \cdot I_4 \quad (2)$$

$$R_1 \cdot I_4 = V_T \ln(I_{C1}/I_4) \quad (3)$$

In a case where the switching device SW₁ is on, when $R_1 = 50$ Kω, $V_T = 0.0259$ and $I_{C1} = I_1 = 4 \,\mu A$ are substituted in the equation (3), the following relations hold:

$$I_4 = 0.82 \,\mu A \quad (4)$$

$$I_{B1} = 3.18 \,\mu A \quad (5)$$

Immediately after the switching device SW₁ is switched from the on state to the off state, from the following relations, $V_A = 0.6$ V $I_{C1} = 4 \,\mu A$ the following equation is obtained:

$$\begin{aligned} I_{B1} &= I_{C1}/\beta \quad (6) \\ &= 0.02 \,\mu A \end{aligned}$$

Furthermore, from the equation (4), the following relation hold:

$$I_4 = 0.82 \,\mu A \quad (7)$$

Charges accumulated in the junction capacitance $C_{BE}$ begin to be discharged with an initial current of $(I_{B1} + I_4)$. This initial current is approximately 40 times the above described initial current (0.02 μA) in a case where no series circuit is provided. The current $I_{C1}$ flowing in the transistor TR₁ is rapidly decreased, so that the transistor TR₁ is turned off at high speed.

In the above described manner, fast response of switching is achieved.

Figure 2:
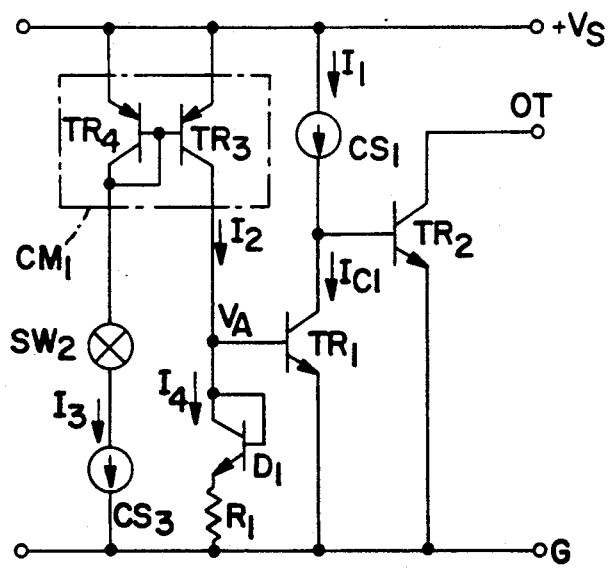
FIG. 2 is a circuit diagram showing a switching circuit according to a second embodiment of the present invention.

FIG. 2 shows a switching circuit according to a second embodiment in which a switching transistor TR₁ is controlled through a current mirror circuit CM₁. The current mirror circuit CM₁ comprises two pnp transistors TR₃ and TR₄. If a switching device SW₂ is turned on, an output current I₃ of a current source CS₃ flows into a base of the transistor TR₁ through the current mirror circuit CM₁ as a current I₂ (I₂ = I₃). Accordingly, this transistor TR₁ is turned on and a transistor TR₂ in the output stage is turned off. On the other hand, if the switching device SW₂ is turned off, the current flowing into the base of the transistor TR₁ from the current mirror circuit CM₁ is theoretically cut off. Accordingly, the transistor TR₁ is turned off and the transistor TR₂ is turned on.

Figure 5:
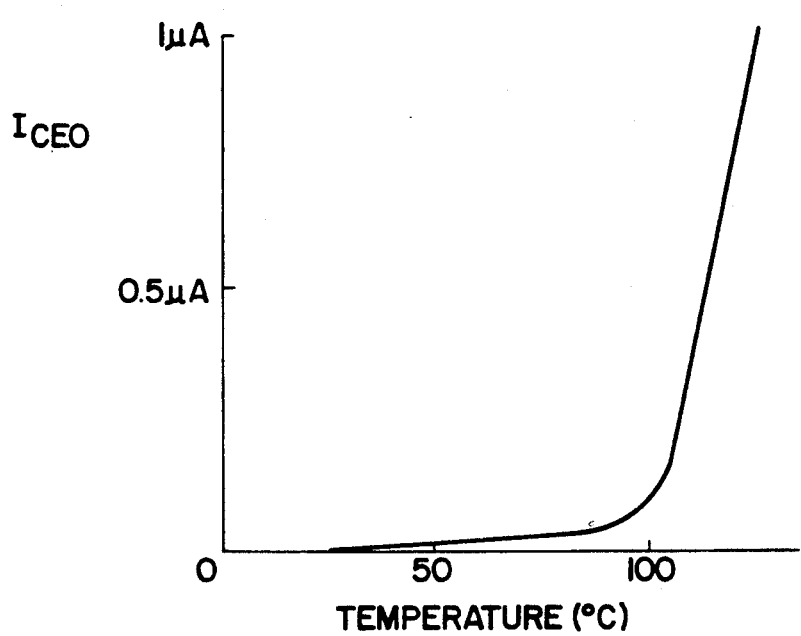
FIG. 5 is a graph showing temperature characteristics of a collector leakage current $I_{CED}$ in a pnp transistor.

A collector leakage current $I_{CEO}$ in the pnp transistor is several hundred picoamperes at ordinary temperatures, while being rapidly increased to approximately several hundred nanoamperes at higher temperatures around 100° C., as shown in FIG. 5. The switching circuit constructed as described above has the following disadvantage. More specifically, if the switching circuit is driven by very small currents I₁ and I₃ of approximately 1 to 4 μA, a collector current $I_{C1}$ in the transistor TR₁ is on the order of μA at temperatures around 100° C. from the equation $I_{C1} = h_{fe} \times I_{CEO}$. Accordingly, the transistor TR₁ is turned on and the transistor TR₂ is turned off only by the collector leakage current in the pnp transistor $TR_3$ constituting the current mirror circuit $CM_1$.

The foregoing will be quantitatively described as follows.

Let the collector leakage current $I_{CEO}$ in the pnp transistor be 100 pA at a temperature of 25° C., 100 nA at a temperature of 100° C., and 1 μA at a temperature of 125° C. In addition, the current sources $CS_1$ and $CS_3$ shall be very small current sources, their output currents $I_1$ and $I_3$ being taken as 4 μA.

(1) When the switching device $SW_2$ is in the off state, compare a case where temperature is 25° C. with a case where it is 100° C.

Case Where Temperature is 25° C.

Let the direct current amplification factor $\beta$ in the transistor $TR_1$ be 200. The collector current $I_{C1}$ in the transistor $TR_1$ is represented by the following equation:

$$\begin{aligned} I_{C1} &= \beta I_{CEO} \\ &= 40 \text{ nA} \\ &<< I_1 = 4 \text{ μA} \end{aligned}$$

Therefore, the transistor $TR_1$ is off, so that the output transistor $TR_2$ is fully driven by the current $I_1$. Accordingly, the transistor $TR_2$ is turned on. More specifically, a normal operation is performed.

Case Where Temperature is 100° C.

The collector current $I_{C1}$ in the transistor $TR_1$ is represented by the following equation:

$$\begin{aligned} I_{C1} &= \beta I_{CEO} \\ &= 40 \text{ μA} \\ &>> I_1 = 4 \text{ μA}. \end{aligned}$$

Consequently, the transistor $TR_1$ is turned on by the collector leakage current $I_{CEO}$, so that no driving current is applied to a base of the output transistor $TR_2$. Accordingly, the transistor $TR_2$ is turned off. More specifically, a malfunction occurs.

(2) Description is now made of a case where the switching device $SW_2$ is on. The following relation holds:

$$\begin{aligned} I_{C1} &= \beta I_2 \\ &\approx \beta I_3 \\ &= 800 \text{ μA} >> I_1 \end{aligned}$$

Accordingly, the transistor $TR_1$ is turned on, so that the driving current $I_1$ to the output transistor $TR_2$ can be fully cut off. Accordingly, the transistor $TR_2$ is turned off. More specifically, a normal operation is performed.

In order to the above described problems, according to the present invention, a series connecting circuit comprising a diode-connected transistor $D_1$ and a resistor $R_1$ is connected between the base of the switching transistor $TR_1$ and ground G.

The function of this series connecting circuit will be quantitatively described as follows.

A case where the switching device $SW_2$ is on is described by the expressions (4) and (5).

Then, when the switching device $SW_2$ is off, compare a case where the ambient temperature is 25° C. with a case where it is 100° C.

When temperature is 25° C., $I_{CEO}$ = 100 pA. Accordingly, even if $I_4$ = 100 pA, the following relation holds from the equation (3):

$$I_{C1} \approx 100 \text{ pA} << I_1 \tag{8}$$

This collector current is substantially smaller than the driving current $I_1$ in the transistor $TR_2$ in the output stage. Accordingly, the transistor $TR_2$ is turned on. More specifically, a normal operation is performed.

When temperature is 100° C., $I_{CEO}$ = 100 nA. Accordingly, even if $I_4$ = 100 nA, the following relation holds from the equation (3):

$$I_{C1} \approx 0.12 \text{ μA} << I_1 \tag{9}$$

This collector current is substantially smaller than the driving current $I_1$ in the transistor $TR_2$. Accordingly, the transistor $TR_2$ is turned on. More specifically, a normal operation is achieved also in this case.

As described in the foregoing, the collector leakage current $I_{CEO}$, which becomes several hundred nanoamperes in the environment at high temperatures, in the pnp transistor $TR_3$ flows through the diode-connected transistor $D_1$ and the resistor $R_1$. Accordingly, this leakage current does not flow in the base of the switching transistor $TR_1$ by setting the resistor $R_1$ to a suitable value. Consequently, occurrence of a malfunction can be previously prevented.

Meanwhile, the same effect can be theoretically obtained even if a series circuit comprising a diode functional device and a resistor is replaced with only a resistor. When a resistor is formed in an integrated circuit, however, the area of the resistor is significantly increased. Accordingly, the area which is approximately 10 to 15 times larger than that in the above described embodiment is required to obtain the same effect using only the resistor. Consequently, construction in the embodiments shown in FIGS. 1 and 2 (a series connecting circuit comprising a diode functional device and a resistor) is preferable so as to increase integration density.

Figure 3:
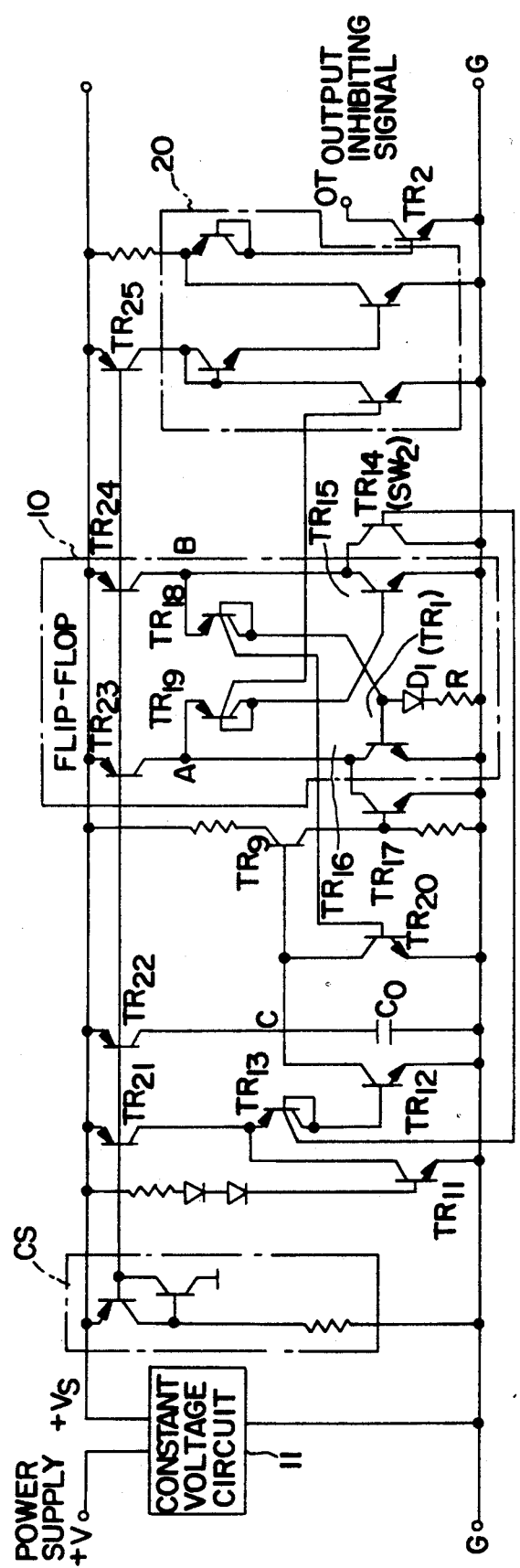
FIG. 3 is a circuit diagram showing a power reset circuit which is an application of the switching circuit.
Figure 4:
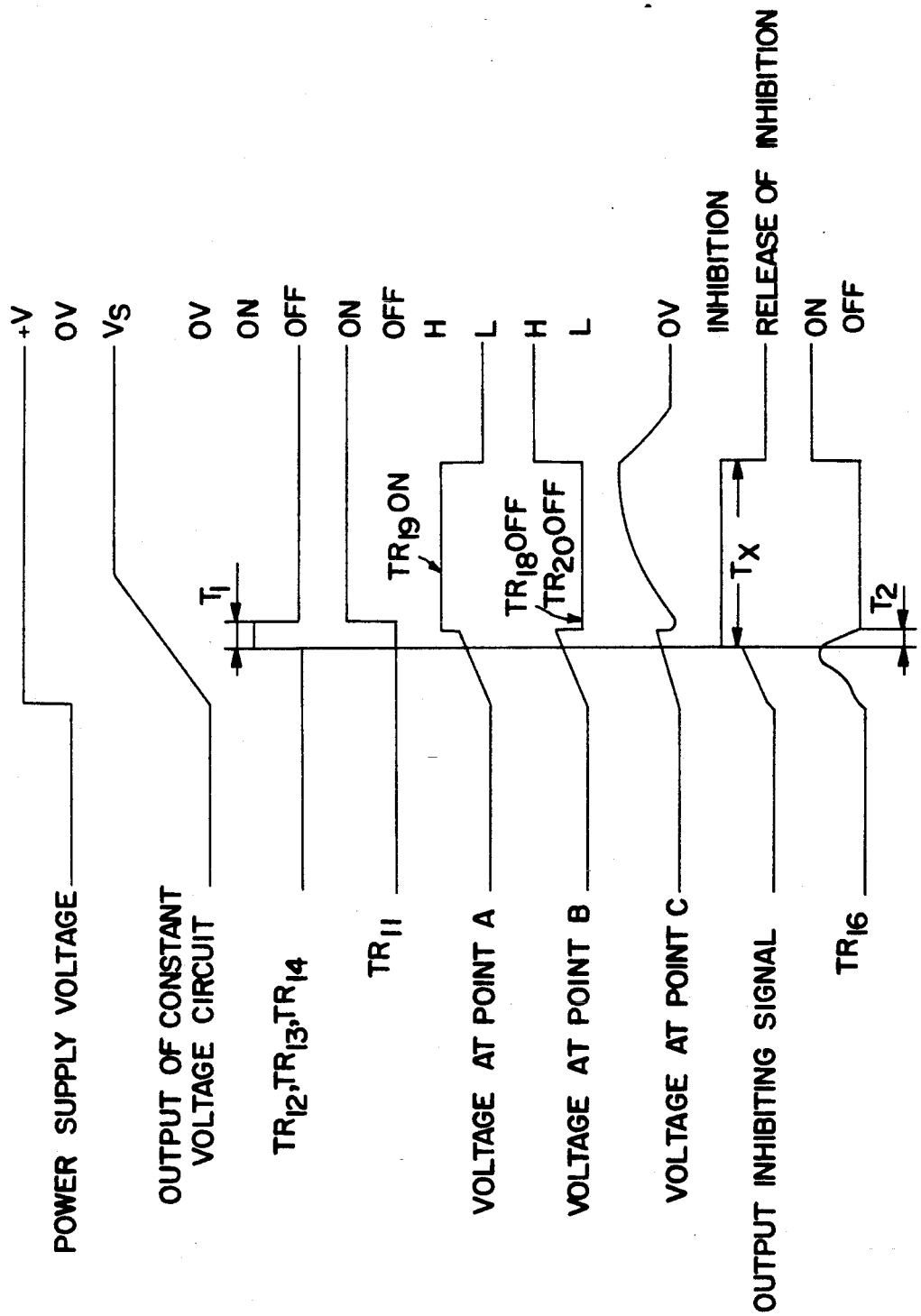
FIG. 4 is a timing chart showing an operation of the power reset circuit.

FIG. 3 shows an application of the above described switching circuit. A circuit shown in FIG. 3 is a power reset circuit provided in a proximity switch or the like. More specifically, immediately after the power supply is turned on, a detection signal of the proximity switch or the like may, in some cases, present an erroneous detected state due to the rise of each circuit. In order to prevent such a malfunction, the power rest circuit performs such a function as to inhibit the detection signal from being outputted during a constant time period immediately after the power supply is turned on. A signal for inhibiting output of the detection signal is outputted from the transistor $TR_2$. FIG. 4 is a waveform diagram showing an operation of this power reset circuit.

Referring now to FIGS. 3 and 4, the power reset circuit includes a constant voltage circuit 11. When the power supply is turned on, an output voltage of this constant voltage circuit 11 rises, to be settled at a constant voltage $V_S$ at the time point when a given time period has elapsed. An output inhibiting signal is outputted in the time $T_X$ elapsed from the time of turn-on of the power supply until the output voltage of the constant voltage circuit 11 is settled at the constant voltage $V_S$.

The switching circuit is incorporated in a flip-flop 10 and an output buffer circuit 20 driven by said flip-flop. The flip-flop 10 is initially reset immediately after the power supply is turned on. More specifically, the flip-flop 10 is reset such that a potential at the point A attains an H level and a potential at the point B attains an L level. As a result, current flows into an output buffer circuit 20 through a current mirror circuit comprising a transistor $TR_{19}$. Accordingly, an output transistor $TR_2$ is turned on (output is inhibited). The constant time $T_X$ is measured by charging time of a capacitor $C_O$. When the capacitor $C_O$ is charged, until its output voltage (a potential at the point C) reaches a certain value, a transistor $TR_9$ is turned on. In addition, a transistor $TR_{17}$ is turned on. As a result, the potential at the point A is pulled down to the L level.

This power reset circuit will be described in more detail. A current source CS is connected to the output side of the constant voltage circuit 11. Transistors $TR_{21}$, $TR_{22}$, $TR_{23}$, $TR_{24}$ and $TR_{25}$ respectively serving as current sources are driven by this current source CS.

The flip-flop 10 comprises transistors $TR_{18}$ and $TR_{19}$ respectively constituting current mirror circuits and transistors $TR_{15}$ and $TR_{16}$. The transistor $TR_{16}$ corresponds to the switching transistor $TR_1$ shown in FIGS. 1 and 2. A series circuit comprising a diode $D_1$ and a resistor $R_1$ is connected between a base of this transistor $TR_{16}$ and ground G. Transistors $TR_{14}$ and $TR_{17}$ for inversion are respectively connected in parallel to the transistors $TR_{15}$ and $TR_{16}$. The transistor $TR_{14}$ corresponds to the above described switching device $SW_2$.

Transistors $TR_{12}$, $TR_{13}$ and $TR_{14}$ are turned on when an output voltage of the constant voltage circuit 11 becomes approximately $2V_{BE}$ (approximately 1.2 V), while a transistor $TR_{11}$ is turned on when it becomes approximately $3V_{BE}$ (approximately 1.8 V).

When the output voltage of the constant voltage circuit 11 begins to rise, the capacitor $C_O$ begins to be charged through the transistor $TR_{22}$. When the output voltage becomes approximately $2V_{BE}$, the transistors $TR_{12}$, $TR_{13}$ and $TR_{14}$ are turned on. The transistor $TR_{12}$ is turned on, thereby causing charges accumulated in the capacitor $C_O$ to be discharged through this transistor $TR_{12}$. In addition, the transistor $TR_{14}$ is turned on, thereby causing the potential at the point B to attain the L level. Accordingly, a collector current in the transistor $TR_{14}$ is not applied to the base of the transistor $TR_{16}$, so that the transistor $TR_{16}$ is turned off. As a result, the potential at the point A attains the H level. This is initial reset of the flip-flop. A transistor $TR_{20}$ is also turned off.

Thereafter, when the output voltage of the constant voltage circuit 11 becomes approximately $3V_{BE}$, the transistor $TR_{11}$ is turned on. Accordingly, the transistors $TR_{12}$, $TR_{13}$ and $TR_{14}$ are turned off. Consequently, charging of the capacitor $C_O$ is resumed. The initial reset state of the flip-flop 10 continues until a charging voltage of the capacitor $C_O$ reaches a predetermined value as described above.

In the foregoing, if the transistor $TR_{16}$ is not turned off in the time (time $T_1$) elapsed from the time when the transistors $TR_{12}$, $TR_{13}$ and $TR_{14}$ are turned on until they are turned off, the flip-flop is not initially reset. More specifically, let $T_2$ be the time elapsed from the time of turn-on of the transistor $TR_{12}$ or the like until the transistor $TR_{16}$ is turned off. In this case, the relation $T_1 > T_2$ must be satisfied.

However, when the rise of the output voltage of the constant voltage circuit 11 becomes abrupt, the time $T_1$ becomes short. Accordingly, the transistor $TR_{16}$ must be quickly switched from the on state to the off state. This is a reason why the series circuit comprising the diode $D_1$ and the resistor $R_1$ is connected to the base of the transistor $TR_{16}$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A switching circuit, comprising:
   a first circuit comprising a switching device having an on state and an off state and a first current source connected in series, said first current source producing a first output current;
   a current mirror circuit comprising a plurality of transistors and driven by said first circuit, said current mirror circuit outputting a current when said switching device is in the on state;
   a second circuit comprising a second current source producing a second output current and a first switching transistor connected in series, said first switching transistor having a base, a collector, and an emitter, wherein the output current of said current mirror circuit is applied to the base of said first switching transistor so that the first switching transistor is turned on when said switching device is in the on state;
   an output stage comprising a second switching transistor controlled by said first switching transistor and having a base, wherein said second output current is connected to said base of said second switching transistor, and wherein said second switching transistor is turned off when said first switching transistor is turned on so that the output current of said second current source flows in said first switching transistor;
   a third circuit comprising a diode functional device and a resistor connected in series, wherein said third circuit is connected between the base of said first switching transistor and one of the emitter and the collector thereof;
   wherein said third circuit causes a collector leakage current in certain of the transistors of the current mirror circuit to flow therethrough when said first switching transistor is turned off.

2. A switching circuit, comprising:
   a first circuit comprising a switching device having an on state and an off state and a first current source connected in series, said first current source producing a first output current;
   a current mirror circuit comprising two transistors and driven by said first circuit, said current mirror circuit outputting a current equal to said first output current when said switching device is in the on state;
   a second circuit comprising a second current source producing a second output current and a first switching transistor connected in series, said first switching transistor having a base, a collector, and an emitter, wherein the output current of said current mirror circuit is applied to the base of said first switching transistor so that the first switching transistor is turned on when said switching device is in the on state;

an output stage comprising a second switching transistor controlled by said first switching transistor and having a base, wherein said second output current is connected to said base of said second switching transistor, and wherein said second switching transistor is turned off when said first switching transistor is turned on so that the output current of said second current source flows in said first switching transistor; and a third circuit comprising a diode functional device and a resistor connected in series, wherein said third circuit is connected between the base of said first switching transistor and one of the emitter and the collector thereof;

wherein said third circuit causes a collector leakage current in one of the two transistors of the current mirror circuit to flow therethrough when said first switching transistor is turned off.

3. A switching circuit, comprising;

a first circuit comprising a switching device having an on state and an off state and a first current source connected in series;

a current mirror circuit driven by said first circuit and producing an output current, wherein the current mirror stops producing the output current when the switching device is moved to the on state;

a second circuit comprising a current source and a switching transistor connected in series, said switching transistor having a base, a collector, and an emitter, wherein the output current of said current mirror is applied to the base of said switching transistor so that said switching transistor is turned off when the output current of said current mirror circuit stops; and a third circuit comprising a diode functional device and a resistor connected in series, wherein said third circuit is connected between the base of said switching transistor and one of the emitter and the collector thereof.

4. A power reset circuit comprising:

a first switching transistor having a base, a collector, and an emitter;

a series circuit comprising a diode functional device and a resistor connected in series, said series circuit being connected between the base of said switching transistor and one of the emitter or collector thereof;

means for turning on said first switching transistor by applying a first current to the base of said first switching transistor;

control means for controlling the application of current to the base of said first switching transistor;

a power supply having an on state and an off state;

output inhibiting means for outputting an output inhibiting signal during a predetermined time period immediately after the power supply is moved to the on state;

voltage producing means for producing an output voltage which rises when the power supply is moved to the on state and which settles at a constant voltage after a given time period has elapsed;

means for resetting said output inhibiting means connected to said output inhibiting means to cause said output inhibiting means to output the output inhibiting signal when the output voltage attains a first level;

measuring means connected to said means for resetting output inhibiting means for measuring said predetermined time period;

means connected to said means for resetting said output inhibiting means for activating said measuring means when the output voltage attains a second level; and means connected to said output inhibiting means for setting said output inhibiting means to cause said output inhibiting means to stop outputting the output inhibiting signal when an output voltage of said measuring means reaches a third level;

wherein said first switching transistor is turned off to reset said output inhibiting means within a time period between when the output voltage of said constant voltage circuit attains the first level and when the output voltage of said constant voltage circuit attains the second level.

5. A power reset circuit as claimed in claim 4, wherein said means for outputting an output inhibiting signal comprises an output buffer circuit driven by a flip-flop.

6. A power reset circuit as claimed in claim 4, wherein said measuring means comprises a capacitor.

* * * * *